United States Patent [19]

Potter

[11] Patent Number: 4,681,655

[45] Date of Patent: Jul. 21, 1987

[54] ELECTRICAL INTERCONNECT SUPPORT SYSTEM WITH LOW DIELECTRIC CONSTANT

[75] Inventor: Curtis N. Potter, Austin, Tex.

[73] Assignee: Microelectronics and Computer Technology Corporation, Austin, Tex.

[21] Appl. No.: 934,367

[22] Filed: Nov. 24, 1986

[51] Int. Cl.[4] ............................................ H01L 21/00
[52] U.S. Cl. .................................. 156/632; 156/630; 156/644; 156/659.1; 156/665; 156/667
[58] Field of Search .................... 156/659.1, 667, 665, 156/644, 629, 630, 632

[56] References Cited

U.S. PATENT DOCUMENTS

| | | | |
|---|---|---|---|
| 3,789,470 | 2/1974 | Owaki et al. ...................... | 156/629 |
| 4,023,999 | 5/1977 | Lindberg et al. .................. | 156/644 |
| 4,155,155 | 5/1979 | Bourdon et al. ................... | 156/665 |
| 4,480,288 | 10/1984 | Gazdik et al. ..................... | 156/644 |
| 4,541,893 | 9/1985 | Knight .............................. | 156/643 |

*Primary Examiner*—S. Leon Bashore
*Assistant Examiner*—Lori-Ann Cody
*Attorney, Agent, or Firm*—Fulbright & Jaworski

[57] ABSTRACT

A method of fabricating an anodic aluminum support system having an air bridge for metallic conductors. The method includes providing two or more metal layers separated by a coating of aluminum creating a multiple layer electrical interconnect system. The method includes the step of anodizing the aluminum and applying a photoresist mask to spaced portions of the top of the system. Thereafter, an etching solution is applied to the top of the system for removing the anodized aluminum, except for the portions covered by the mask, thereby providing a multilayer conductor system supported by pillars of anodic aluminum surrounded by low dielectric air.

6 Claims, 4 Drawing Figures

(TOP VIEW)

(SECTION VIEW 2-2)

(SECTION VIEW 3-3)

(TOP VIEW)

ELECTRICAL INTERCONNECT SUPPORT SYSTEM WITH LOW DIELECTRIC CONSTANT

BACKGROUND OF THE INVENTION

It is well known to fabricate mutiple layers of metal conductors embedded in a dielectric material and supported therein for connecting the conductors to various electrical components such as semiconductors. For example, a multiple layer electrical interconnect system may include conductors extending in the X, Y and Z directions including through via conductors in a multilayer sandwich embedded in a dielectric of continuous anodic aluminum. However, the anodic aluminum, $Al_2O_3$, has a rather higher dielectric constant than is desired for very high speed interconnect transmission lines.

The present invention is directed to a method of removing the bulk of the anodic aluminum by masking and etching thereby leaving pillars of anodic aluminum in order to support the metal conductors and for surrounding the major portions of the conductors with air which has a low dielectric constant.

SUMMARY

The present invention is directed to the method of fabricating an anodic aluminum support system having an air bridge for metallic conductors including the steps of providing two or more metal layers separated by a coating of aluminum creating a multiple layer electrical interconnect system. The steps include anodizing the aluminum and applying a photoresist mask to spaced portions of the top of the system and thereafter applying an etching solution to the top of the system for removing the anodized aluminum except for the portions covered by the mask thereby providing a multilayer conductor system supported by pillars of anodic aluminum surrounded by low dielectric air.

The method further includes wherein one of the metal layers extends in the X direction and one of the layers extends in the Y direction.

The method further includes wherein the aluminum is anodized by sulfuric acid solution and the etching solution includes hydrofluoric acid.

Still a further object of the present invention is wherein the system includes a coating of aluminum on the top of the system prior to anodizing.

Other and further objects, features and advantages will be apparent from the following description of a presently preferred embodiment of the invention, given for the purpose of disclosure and taken in conjunction with the accompanying drawings.

DESCRIPTION OF THE PREFERRED EMBODIMENT

While the present invention will be directed to describing a method of fabricating a multiple layer electrical interconnect system having X direction, Y direction and Z direction conductors, for purposes of illustration only, it is to be understood that the present invention is directed to the fabrication of various types of systems with electrical interconnects in multiple layers and extending in various directions and including through via conductors in a multilayer sandwich.

Figure 1:
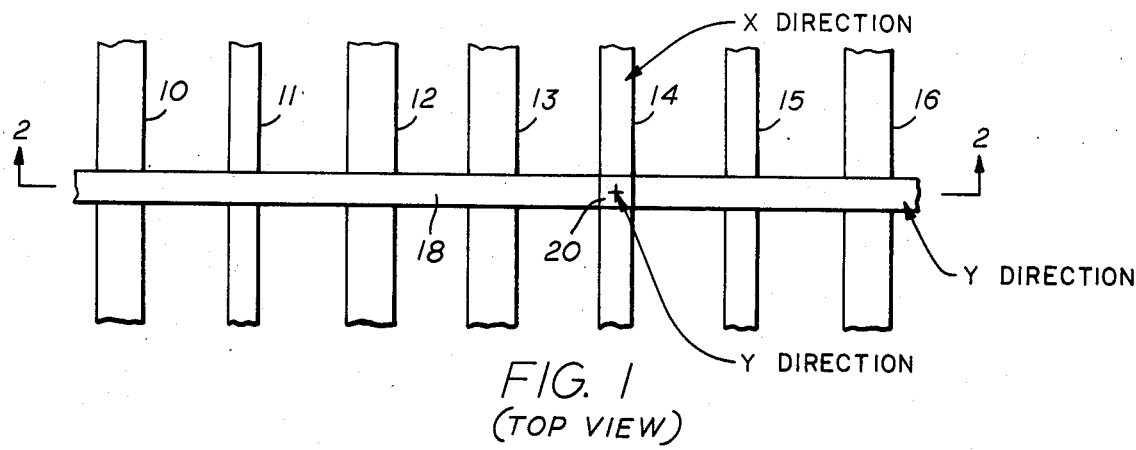
FIG. 1 is a top elevational view of the positioning of various X conductors, a Y conductor, and Z conductors positioned for use in a multiple layer interconnect system.

Referring now to FIG. 1, X direction conductors 10, 11, 12, 13, 14, 15 and 16, and a Y direction conductor, 18 and Z direction conductors 20 and 22 is best seen positioned in a top view, in which the conductors are to be included in a multilayer sandwich electrical interconnect. The conductor 20 may be used as a via conductor.

Figure 2:
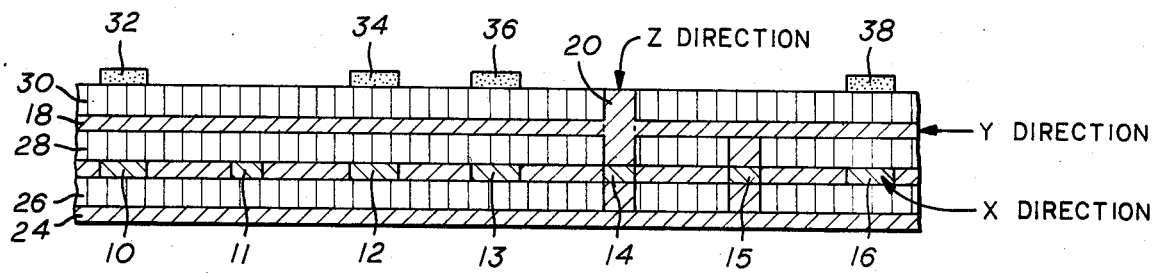
FIG. 2 is a cross-sectional view taken along the line 2—2 of FIG. 1 including the interconnect conductors of FIG. 1 in a system embedded in a matrix of continuous anodic aluminum and a mask placed thereon.

Referring to FIG. 2, a metal ground plate 24 is shown along with the conductors which are separated by layers 26, 28 and 30. The conductors 10, 11, 12, 13, 14, 15, 16, 18, 20 and 22 may be of any suitable metal, such as copper, silver, gold, molybdenum, niobium, tantalum, titanium, vanadium, etc. While the multilayer interconnect system shown in FIG. 2 may be fabricated in any desirable manner, size and thickness, one preferred embodiment provide coats or layers by plating in which the metal conductors have a thickness of 5 microns and the layers 26, 28 and 30 have a thickness of 10 microns. The layers 26, 28 and 30 are initially aluminum or an aluminum alloy film which are anodized such as by a conventional sulfuric acid anodizing solution.

While the anodized aluminum layers 26, 28 and 30 provide a dielectric between the metal layers 10, 11, 12, 13, 14, 15, 16, 18, 20, 22 and 24, and also a support therebetween, the anodized aluminum, $Al_2O_3$, has a rather higher dielectric constant than is desired for very high speed interconnect transmission lines for use with high speed semiconductors. The present invention is directed to removing the bulk of the anodic aluminum by masking and etching and leaving only pillars of anodic aluminum in order to support the metal conductors thereby providing an air bridge which has a low dielectric constant.

Figure 3:
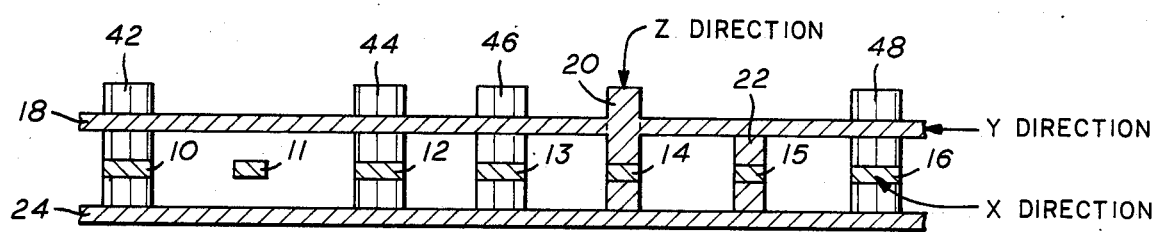
FIG. 3 is a cross-sectional view similar to FIG. 2 after etching away the undesired portions of the anodic aluminum.
Figure 4:
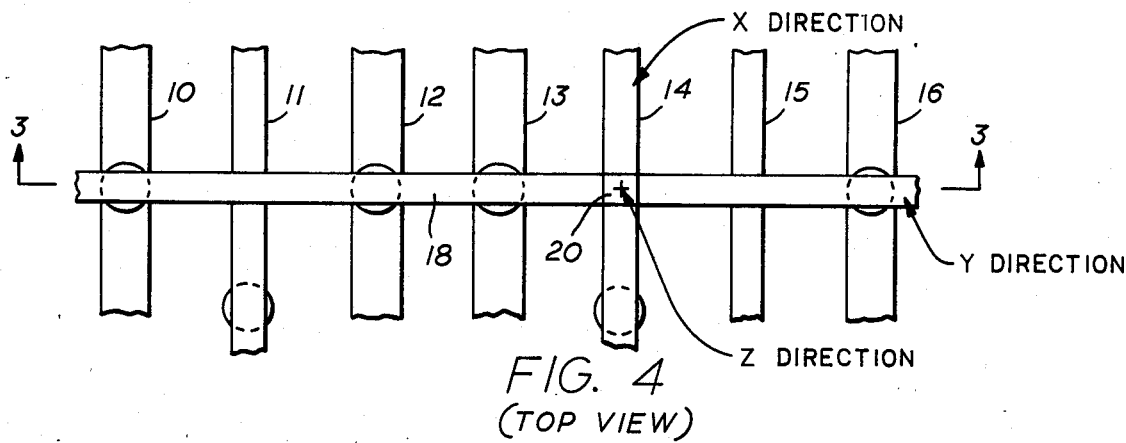
FIG. 4 is a top view of the structure of FIG. 3.

Therefore, a resist mask such as mask 32, 34, 36, and 38 are applied to spaced portions of the top 40 of the system at which it is desired to create support pillars. For example, a conventional photoresist mask is applied to the surface 32 of the top layer 30 and a pattern is photolithographically printed and the resist then developed and cured as is conventional. Thereafter, the resist masks 32, 34, 36 and 38 are used as etch masks and the anodic aluminum is etched. Hydrofluoric acid and hydrofluoric acid diluted in water may be used. Since anodic aluminum is columnar in microstructure, the etch is essentially anisotropic, that is, it yields a rather straight walled groove in the anodic aluminum as shown in FIG. 3. Therefore, supporting pillars 42, 44, 46 and 48 are provided for supplying support between the metal conductors. This results in an air bridge structure having a low dielectric constant.

Therefore, the present method describes fabricating a multilevel conductor system which is temporarily supported by anodic aluminum, followed by the removal of the bulk of the anodic aluminum after fabrication, to make use of the low dielectric constant of air.

The present invention, therefore, is well adapted to carry out the objects and attain the ends and advantages mentioned as well as others inherent therein. While a presently preferred embodiment of the invention has been given for the purpose of disclosure, numerous changes in the details of the steps of the method, will be readily apparent to those skilled in the art and which are encompassed within the spirit of the invention and the scope of the appended claims.

What is claimed is:

1. A method of fabricating an anodic aluminum support system for metallic conductors comprising, providing two or more metal layers, separated by a coating of aluminum, creating a multiple layer electrical interconnect system, anodizing the aluminum, applying a resist mask to spaced portions of the top of the system, applying an etching solution to the top of the system for removing the anodized aluminum except for the portions covered by the mask thereby providing a multilayer conductor system supported by pillars of anodic aluminum surrounded by low dielectric air.

2. The method of claim 1 wherein one of the metal layers extends in the X direction and one of the metal layers extends in the Y direction.

3. The method of claim 1 wherein the aluminum is anodized by a sulfuric acid solution.

4. The method of claim 1 wherein the etching solution includes hydrofluoric acid.

5. The method of claim 1 wherein the system includes a coating of aluminum on top of the system prior to anodizing.

6. A method of fabricating an anodic aluminum support system having an air bridge for metallic conductors comprising, making a multiple layer interconnect system by depositing a first metal layer extending in the X direction and a second metal layer extending in the Y direction and a third layer extending in the Z direction onto a ground plate each of which layer is separated by a coating of aluminum, anodizing the aluminum, applying a photoresist mask to spaced positions of the top of the system, applying an etching solution to the top of the system for removing all of the anodized aluminum except for the portions covered by the mask thereby providing a multilayer conductor supported by pillars of anodic aluminum surrounded by low dielectric air.

* * * * *